United States Patent [19]

Chen et al.

[11] Patent Number: 5,078,804
[45] Date of Patent: Jan. 7, 1992

[54] I-III-VI$_2$ BASED SOLAR CELL UTILIZING THE STRUCTURE CUINGASE$_2$CDZNS/ZNO

[75] Inventors: Wen S. Chen; John M. Stewart, both of Seattle, Wash.

[73] Assignee: The Boeing Company, Seattle, Wash.

[21] Appl. No.: 569,411

[22] Filed: Aug. 17, 1990

Related U.S. Application Data

[63] Continuation-in-part of Ser. No. 372,290, Jun. 27, 1989, abandoned, which is a continuation-in-part of Ser. No. 189,784, May 4, 1988, abandoned.

[51] Int. Cl.$^5$ ............... H01L 31/072; H01L 31/0328; H01L 31/18
[52] U.S. Cl. ..................................... 136/260; 136/264; 136/265; 357/16; 357/30; 437/5
[58] Field of Search ........................ 136/260, 264, 265; 357/16, 30 E, 30 J; 437/5

[56] References Cited

U.S. PATENT DOCUMENTS

| | | | |
|---|---|---|---|
| 4,523,051 | 6/1985 | Mickelsen et al. | 136/260 |
| 4,611,091 | 9/1986 | Choudary et al. | 136/260 |
| 4,612,411 | 9/1986 | Wieting et al. | 136/265 |

OTHER PUBLICATIONS

N. C. Sharma et al., Thin Solid Films, vol. 60, pp. 55-59 (1979).
S. Major et al., Solar Energy Materials, vol. 17, pp. 319-327 (1988).
W. E. Devaney et al., Progress Report, DOE Contract Z1-8-06031-8, Apr. 1989, NTIS Order No. 89009449, Oct. 1989.

Primary Examiner—Aaron Weisstuch
Attorney, Agent, or Firm—Lisa & Associates

[57] ABSTRACT

A thin film I-III-VI$_2$ based solar cell having a first layer of copper indium gallium selenide, a second layer of cadmium zinc sulfide, a double layer of zinc oxide, and a metallization structure comprised of a layer of nickel covered by a layer of aluminum. An optional antireflective coating may be placed on said metallization structure. The cadmium zinc sulfide layer is deposited by means of an aqueous solution growth deposition process and may actually consist of two layers: a low zinc content layer and a high zinc content layer. Photovoltaic efficiencies of 12.5% at Air Mass 1.5 illumination conditions and 10.4% under AM0 illumination can be achieved.

28 Claims, 2 Drawing Sheets

I-III-VI$_2$ BASED SOLAR CELL UTILIZING THE STRUCTURE CUINGASE$_2$CDZNS/ZNO

The Government of the United States of America has rights in this invention pursuant to Contract No. ZL-8-06031-8 awarded by the U.S. Department of Energy.

Related Applications

This application is a continuation-in-part of application Ser. No. 07/372,290 filed June 27, 1989, now abandoned, which is a continuation in part of our application Ser. No. 07/189,784 filed May 4, 1988 (now abandoned) and is related to a commonly owned co-pending application Ser. No. 07/372,271 filed June 27, 1989 (now abandoned).

The present invention pertains generally to solar cell structures, and, in particular to a new, thin film multilayer heterojunction photovoltaic structure which provides increased power conversion efficiency under both terrestrial and space illumination conditions.

BACKGROUND OF THE INVENTION

The Mickelson and Chen U.S. Pat. No. 4,335,266, reissued as Re 31,968 discloses methods of making graded I-III-VI$_2$ semiconductors having internal p-n type regions formed by controlling the evaporation of the elements in the ternary compound so as to form a graded resistivity caused by a graded composition in the semiconductor. For example, a graded CuInSe$_2$ thin film semiconductor could be formed with two distinct regions: a copper-rich p-type region near a base contact, and a copper-deficient n-type region near the photoactive junction of the thin film. Photocells produced by Mickelsen and Chen have photovoltaic efficiencies near 10%. This patent also suggests that it would be suitable to use the invention disclosed therein in conjunction with the quaternary compounds CuIn$_{(1-x)}$Ga$_x$Se$_2$ or CuIn$_{(1-x)}$Ga$_x$S$_2$ where x<1.

CuInGaSe$_2$ is a quaternary analog of the ternary compound CuInSe$_2$ in which the Gallium is substituted on some Indium sites and serves to raise the band gap of the absorber to e.g. 1.15 eV for a Ga:In atomic ratio of 0.26:0.74.

In Devaney U.S. Pat. No. 4,684,761, a method is described which provides closer control of the elemental evaporation rates, and the substrate temperature particularly in the regions of the I-III-VI$_2$ semiconductor near the contact and near the photoactive junction. This method provides photovoltaic cells having efficiencies of up to 11.9% AM1 (10.4% AM0) for CuInSe$_2$/CdZnS on alumina.

In our pending application Ser. No. 189,784 filed on May 4, 1988, higher efficiencies are described as resulting from the replacement of the ternary compound CuInSe$_2$ with the quaternary analog CuInGaSe$_2$. The replacement of the ternary compound CuInSe$_2$ with the quaternary compound CuInGaSe$_2$ results in a shift of the absorber band gap to higher energies. This replacement theoretically has an increased device voltage and therefore an increased photovoltaic efficiency.

The higher efficiencies that are theoretically possible with a quaternary compound CuInGaSe$_2$ device have not been achieved for reasons that we believe are due mainly to the high optical absorption of the top window semiconductor layer which typically consists of CdS or CdZnS. The absorption is due in large part to the fundamental absorption edge in the window layer. Prior art cells do not have a window layer which effectively eliminates or significantly reduces window layer absorption.

Zinc oxide is a material which, when used as a window layer material, has shown reduced fundamental absorption losses in the visible and ultraviolet (UV) portions of the spectrum. Unfortunately, CuInSe$_2$/ZnO devices such as are disclosed in the Wieting et al U.S. Pat. No. 4,612,411, result in a somewhat reduced performance that is believed to be due to the leaky junction created between the ZnO layer and the CuInSe$_2$ layer. Additionally, low resistivity ZnO layers have a limited effectiveness due to absorption of the infrared (IR) part of the light spectrum, also referred to as free carrier absorption. Finally, ZnO alone does not appear to form a heterojunction with CuInGaSe$_2$.

Choudary et al. U.S. Pat. No. 4,611,091, describes high efficiency CuInSe$_2$/CdS/ZnO devices utilizing thin CdS layers between CuInSe$_2$ and ZnO. Such devices achieve improved blue light response but show a degraded IR response.

SUMMARY OF THE INVENTION

It is an object of the present invention to provide a new and improved I-III-VI$_2$ based solar cell with higher efficiencies than similar prior art devices.

It is an additional object of the present invention to provide a new and improved CuInGaSe$_2$/CdZnS/ZnO solar cell having a solution grown sulfide layer that is thinner than has been previously used and may be as thin as a few 10s of nanometers. The sulfide layer portion that is in contact with the CuInGaSe$_2$ material may be of a uniform composition or may have a low zinc content whereas the remaining thickness of the CdZnS layer may have a higher zinc content selected for optimum optical transmission. Such a bilayer structure can significantly reduce electrical leakage through the layer as compared to a single layer structure. A ZnO window overlayer is deposited in two steps to form a high resistivity/low resistivity bilayer. The high resistivity layer is on the sulfide layer and presents a resistance at the junction to the CuInGaSe$_2$ material where discontinuities or defects appear in the sulfide layer. The low resistivity layer provides improved lateral current carrying properties and reduces unwanted IR absorption that is due primarily to free carriers. Thin layers which are free of defects give higher energy conversion efficiencies.

The invention may thus provide a p-n heterojunction photovoltaic device comprising the following materials overlaying each other from the bottom of the solar cell to the top of the solar cell wherein the top is the surface which will receive light rays: a substrate such as aluminum oxide (Al$_2$O$_3$); a base contact such as molybdenum (Mo); a quaternary CuInGaSe$_2$ semiconductor, preferably with a mirror region; a first thin-film CdZnS layer having a Zn content which is optimized to match its heterojunction partner and form a non-leaky junction and optionally a second thin-film CdZnS layer with a higher Zn content to provide optimal optical transmission; a first ZnO layer having a high resistivity to form a blocking high resistivity contact at any defect sites in the thin sulfide layer; a second ZnO layer having a high conductivity to serve as a lateral current carrying layer; a metallization grid structure comprising a nickel layer followed by an aluminum layer; and an optional antireflective (AR) coating. The CdZnS layer(s) may be deposited by an aqueous solution growth deposition method as disclosed in a co-pending application Ser. No. 07/372,271 filed June 27, 1989, and entitled "Cadmium Zinc Sulfide By Solution Growth" by Wen Shuh Chen, the disclosure of which is hereby incorporated by reference.

Other objects and advantages will become apparent to those skilled in the art from the claims and from a perusal of the specification in conjunction with the drawings.

DESCRIPTION OF THE PREFERRED EMBODIMENT

Figure 1:
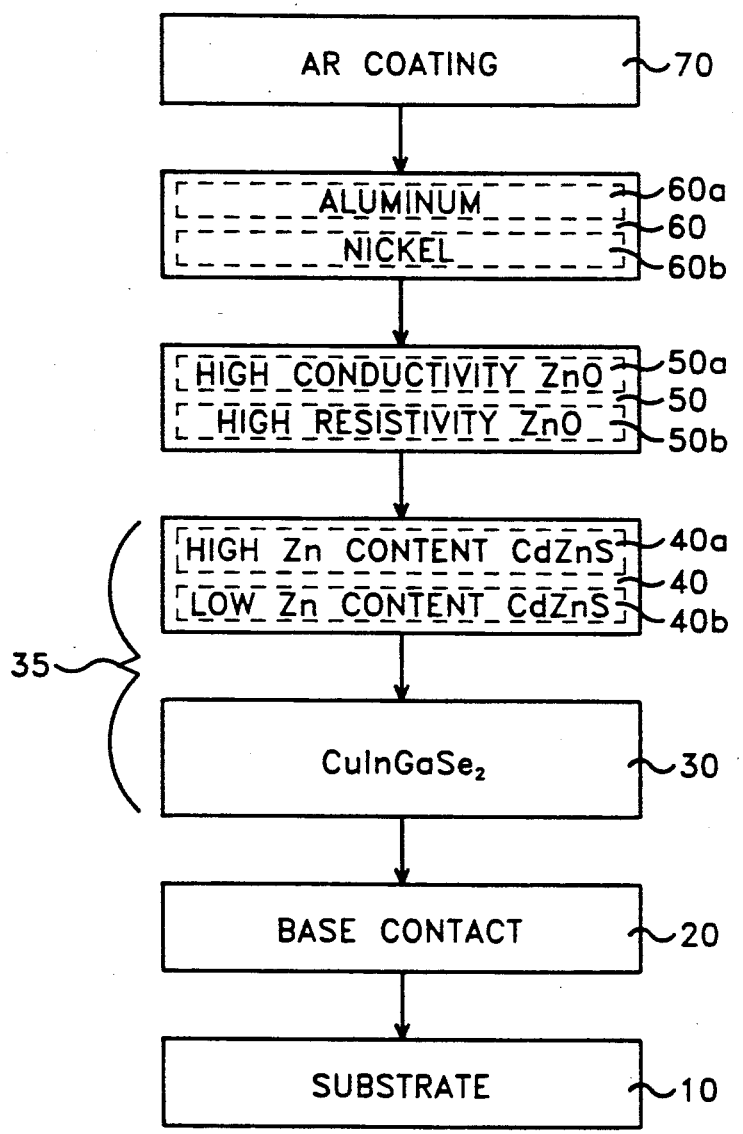
FIG. 1 is a diagrammatic block-and-line representation of the photovoltaic solar cell of the present invention.

Referring specifically to FIG. 1 there has been diagrammatically illustrated in block-and-line form a solar cell embodying the present invention which is effective to provide a light-to-electrical energy p-n type heterojunction photovoltaic device. The active layers of the cell are deposited on substrate 10 which is here preferably formed of polycrystalline aluminum oxide ($Al_2O_3$) having a thickness on the order of 0.025", or enameled steel. A base contact 20 is applied directly on one surface of substrate 10. Base contact 20 is typically comprised of molybdenum (Mo), but the use of other materials is possible. This base contact receives the quaternary copper indium gallium diselenide ($CuIn_xGa_{(1-x)}Se_2$) layer 30 where x is less than 1. CuInGaSe$_2$ layer 30 may consist of a Cu-enriched region followed by a Cu-deficient region to define a composition gradient in layer 30 and serve as a p-type material. In addition, a minority carrier mirror comprising a region rich in gallium relative to indium adjacent to base contact 20 and described in our earlier application Ser. No. 07/189,784 may be employed to provide a mirror region and to further enhance cell efficiency. The gallium rich portion has a band gap higher than needed for optimum photovoltaic performance and improves performance of the device by preventing electrons and holes formed by the light impinged on the device from recombining at the back ohmic contact. The minority carrier mirror is useful with the present invention by contributing to the overall energy conversion efficiency and is included in a preferred embodiment.

Cadmium zinc sulfide region 40 is next deposited on CuInGaSe$_2$ layer 30. The contact between region 40 and CuInGaSe$_2$ layer 30 creates the p-n junction 35 for the photovoltaic device represented in FIG. 1. To form a relatively non-leaky junction, the $Cd_{(1-x)}Zn_xS$ region 40 may be comprised of a first low zinc content layer 40b. Low zinc content layer 40b is typically in the range of x=0.10 to x=0.15 in the expression $Cd_{(1-x)}Zn_xS$ and a high zinc content in layer 40a is in the range of x=0.25 to x=0.35 in the same formula. Alternatively, a single layer having a uniform zinc content of less than about 15% and preferably 13% ($[Zn]/([Zn]+[Cd])$) throughout may be used.

CdZnS region 40 is most effective when it has a thickness between about 20 nm and 50 nm. Response to wavelengths shorter than about 50 nm is increased as the effective sulfide thickness decreases below about 100 nm and particularly below 50 nm. Sulfide thicknesses of about 20 nm are frequently accompanied by discontinuities or defects.

Low Zn content layer 40b in contact with the CaInGaSe$_2$ layer allows the formation of a non-leaky or low lossy junction 35 while the wider bandwidth of high Zn content layer 40a allows for optimal optical transmission. CdZnS region 40 is most effective when it is deposited on the CuInGaSe$_2$ layer by means of a aqueous solution growth method as disclosed, for example, in co-pending application Ser. No. 07/372,271 identified above.

The aqueous solution growth method disclosed in that application involves preparation of two solutions. The first solution may comprise 0.0084M $CdCl_2\cdot2.5 H_2O$, 0.026M $NH_4Cl_2$, 0.26M $NH_4OH$ and $ZnCl_2$. The second solution may comprise 0.0834M thiourea ($(NH_2)_2CS$). The substrate with layer 30 is contacted with a mixture of the two solutions that are continuously stirred while being maintained at a constant temperature of about 85° C. A deposition time of about 30 minutes is effective to produce a CdZnS film having a thickness of 40–50 nm.

An approximate rule for determining the Zn content in the $Cd_{(1-x)}Zn_xS$ can be established by the equation $x=[Zn]/([Zn]+[Cd])$. The amount of $ZnCl_2$ in the first solution will determine the zinc content to be achieved. Thus, for example, for x=0.2 and [Cd]=0.0084, [Zn]=0.0021M.

Film thickness can be modified by a dilution of both solutions while maintaining the relative proportions of each solution. When deposition time and temperature are maintained constant as indicated above, thinner films will be attained by more diluted solutions.

The process described above can also be applied to the aqueous deposition of double layers of different Zn content using a sequential deposition from two different solutions. The layer compositions are then independent of each other and the total film thickness is the sum of the single layer thicknesses.

Solution growth deposition of region 40 makes it possible to obtain an appropriate zinc content and a substantially continuous layer that is sufficiently thin to provide an effective heterojunction cell.

Region 50 consists of a novel dual zinc oxide layer in the form of a coating adhered to the CdZnS material. Layer 50b, in contact with region 40, has a high resistivity and layer 50a which is formed on layer 50b has a high conductivity. The composition and placement of layer 50b provides proper junction characteristics between regions 40 and 50. Any contact between the ZnO layer 50b and the CuInGaSe$_2$ may be current blocking or present at least a high resistance to make the structure tolerant to unwanted holes in the thin CdZnS layer which would allow contact between the ZnO and the CuInGaSe$_2$. The region 50a provides improved transmission in the visible and UV portions of the spectrum and also functions as a high conductivity current collector.

Figure 3:
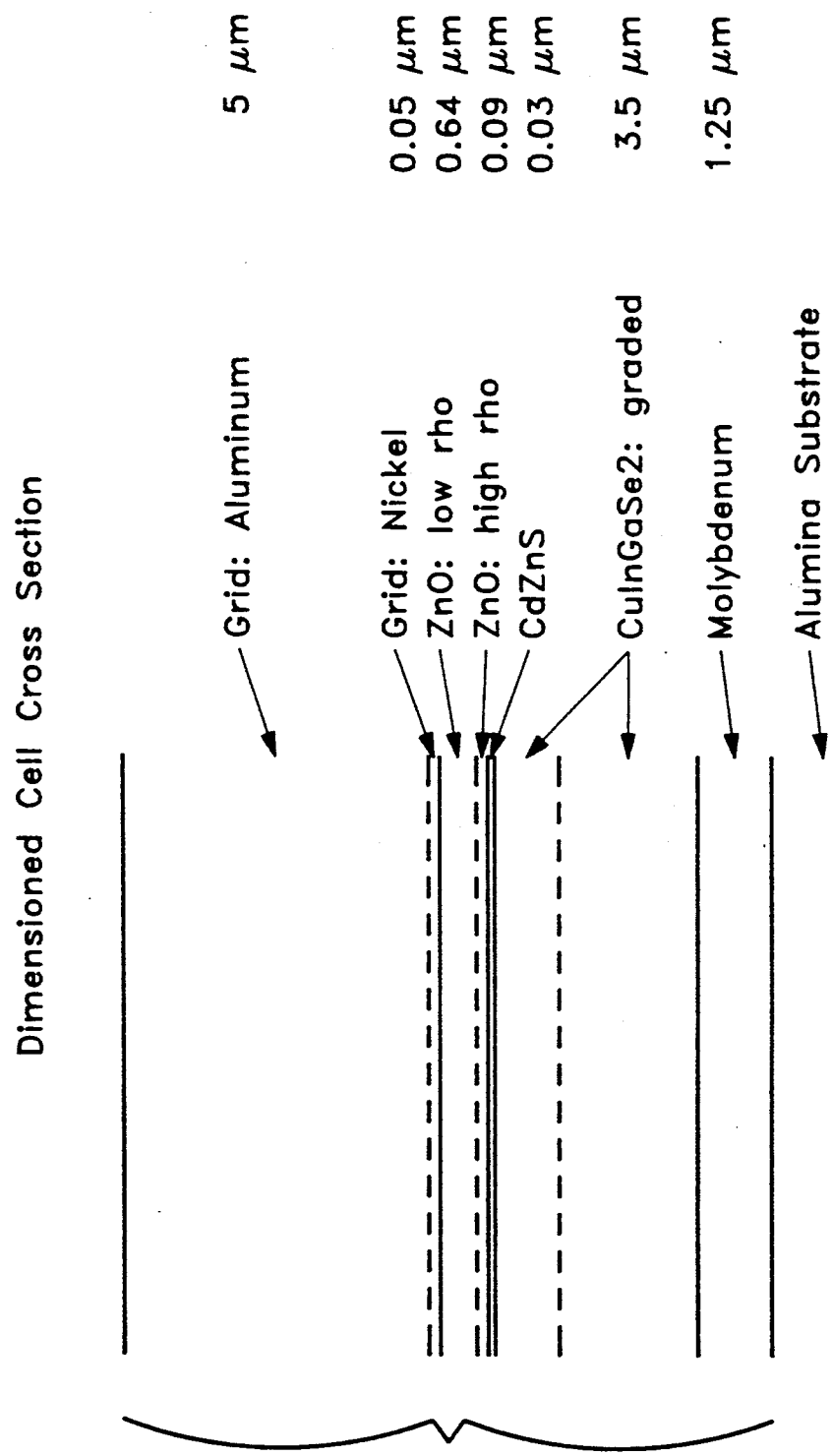
FIG. 3 is a view of a cell cross-section illustrating relative layer thicknesses according to one embodiment of this invention.

The ZnO films may be deposited by RF magnetron sputtering onto a moving substrate in an Argon or Oxygen/Argon atmosphere. The substrates may be at nominal room temperature as no deliberate substrate heating was used. The ZnO used was deposited in two steps to form a high resistivity/low resistivity bilayer as illustrated by layers 50a and 50b in FIG. 1. First a thin (90 nm typical) high resistivity layer was deposited using a relatively high oxygen content ambient, as illustrated in FIG. 3. A thick (640 nm typical) low resistivity layer was then deposited using pure Argon as the ambient. The target was preconditioned in the high oxygen ambient before either deposition. The film resistivity was controlled by the $O_2/Ar$ ratio in the sputtering gas. Film thickness was controlled by substrate speed.

Typical Deposition conditions were:
RF power—1 KW
Total pressure—$5 \times 10^{-3}$ torr
For low resistivity—no oxygen
For high resistivity—$O_2:Ar=1:10$ The ZnO optimization involves a complex trade-off among grid spacing, ZnO thickness, ZnO sheet resistance, ZnO infrared absorption, and ZnO reflection. Using a reasonable grid geometry and a standard set of ZnO process parameters, the ZnO thickness was varied to optimize the trade-off between sheet resistance and transmission. Transmission in this case was dominated by the IR absorption due primarily to free carriers.

This trade-off allowed a lower sheet resistance for the $CuInGaSe_2$ based cells than for the $CuInSe_2$ and provided a lower sensitivity to IR absorption losses. The increase in current due to the thin CdZnS layer is proportionally greater for the $CuInGaSe_2$ device than for the $CuInSe_2$ device which results in a larger efficiency gain for the $ZnO/CdZnS/CuInGaSe_2$ device.

Metallization structure 60, which is used to contact ZnO layer 50, may comprise a nickel layer 60b which may have a thickness of about 50 nm followed by an aluminum layer 60a which may have a thickness of 5-6 micrometers. These dimensions may vary based on the contact grid geometry. An optional antireflective (AR) coating 70 is shown on top of metallization structure 60 in FIG. 1. Although an AR coating is almost always used in prior art solar cells, it is less a necessity in the present invention. Unlike the 15% reflection coefficient found in most conventional devices, the present invention has a reflection coefficient of approximately only 5%. Thus, the use of an AR coating 70 provides improvement to about 2% reflection. When AR coating 70 is implemented on a cell, it is preferably formed by a layer of silicon nitride followed by an overlaying layer of amorphous silicon oxide.

Figure 2:
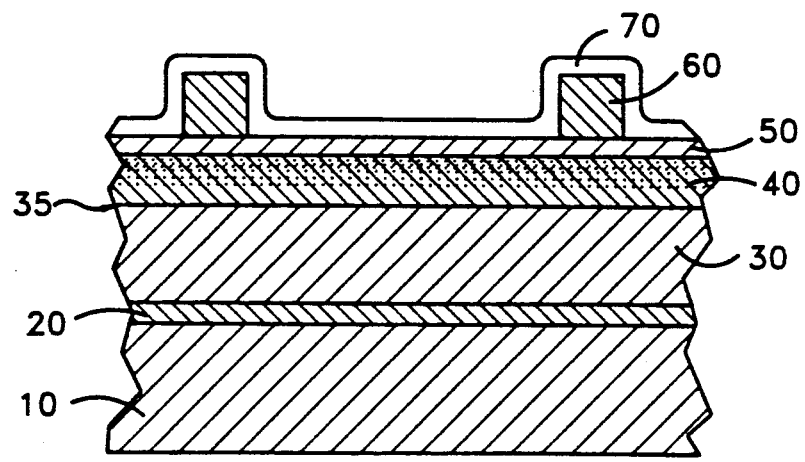
FIG. 2 is a cross-sectional view, not to scale, of a portion of a thin film solar cell according to the present invention.

FIG. 2 is a diagrammatic illustration of a solar cell according to the present invention, and FIG. 3 shows a cross section more nearly to scale with typical values given for dimensions. Substrate 10, base contact 20, $CuInGaSe_2$ layer 30 with a mirror region, CdZnS region 40, p-n junction 35, ZnO region 50, metallization structure 60, and AR coating 70 can all be seen. This structure provides an AM0 illumination photovoltaic efficiency of 10.4% and a AM1.5 illumination efficiency of 12.5%, and thus, an improvement over prior art devices.

Through the application of a thin, solution grown CdZnS layer in a I-III-VI$_2$ based photovoltaic device, a bilayer ZnO region, and a new nickel/aluminum metallization structure an improved photovoltaic device with higher efficiencies at terrestrial and space conditions can be built.

A mirror region is a region rich in gallium relative to indium in layer 30 as described in our co-pending application Ser. No. 07/189,784. The mirror region may be advantageously used with the present invention. Although described in our prior application, this principle will be restated due to its applicability also in connection with the present invention.

This mirror is formed by a region rich in gallium relative to indium, providing near the ohmic contact on the substrate a band gap that is different from the band gap near the heterojunction. The portion of the p-type $CuIn_{(1-x)}Ga_xSe_2$ material adjacent the conductive metal layer which is Ga-rich has a band gap higher than needed for optimum photovoltaic performance while the portion of the $CuIn_{(1-x)}Ga_xSe_2$ material over the minority carrier mirror has a lower Ga concentration that is selected for optimum photovoltaic performance. The high band gap material prevents electrons and holes formed by the light impinged on the device from recombining at the back ohmic contact. The energy barrier due to the high band gap creates a field that repels electrons away from the metal conductor where electrons would have combined with the holes to the detriment of device performance.

While a specific embodiment and several variations of this invention have been shown and described, further modifications and improvements will occur to those skilled in the art. Such modifications and improvements which fall within the scope of the claims, and equivalents thereof, are intended to be covered hereby.

We claim:

1. A thin film multilayer heterojunction photovoltaic device comprising:
   a first layer of copper indium gallium diselenide ($CuInGaSe_2$);
   a second layer in overlaying contact with said first layer and comprising cadmium zinc sulfide (CdZnS);
   a third layer in overlaying contact with said second layer and comprising a high resistivity zinc oxide (ZnO) material; and
   a fourth layer in overlaying contact with said third layer and comprising a high conductivity ZnO material.

2. A thin film multilayer heterojunction photovoltaic device as recited in claim 1 additionally comprising a metal grid contact consisting of a nickel layer in contact with said fourth layer followed by an aluminum layer overlaying said nickel layer, said fourth layer providing lateral current flow to the metal grid contact.

3. A thin film multilayer heterojunction photovoltaic device as recited in claim 2 additionally comprising an antireflective (AR) coating overlaying said metal grid contact.

4. A thin film multilayer heterojunction photovoltaic device as recited in claim 3 wherein said AR coating comprises a layer of silicon nitride.

5. A thin film multilayer heterojunction photovoltaic device as recited in claim 4 wherein said AR coating comprises a layer of amorphous silicon oxide overlaying said silicon nitride layer.

6. A thin film multilayer heterojunction photovoltaic device as recited in claim 1 wherein said second layer is deposited on said first layer by a solution growth process and the zinc content (x in $Cd_{(1-x)}Zn_xS$) is between about $x=0.10$ and $x=0.25$.

7. A thin film heterojunction photovoltaic device as recited in claim 6 wherein said second layer comprises a film having a thickness between about 20 and 50 nm.

8. A thin film multilayer heterojunction photovoltaic device as recited in claim 6 wherein said second layer is graded with a varied zinc content to have a first portion that contacts the first layer with a lower zinc content than a second portion, the zinc content of the second portion being selected to provide optimum optical transmission.

9. A thin film heterojunction photovoltaic device as recited in claim 8 wherein the thickness of the second layer is less than about 40 nm.

10. A device as recited in claim 9 further including a metallized substrate on which the first layer is applied and wherein the first layer includes a minority carrier mirror comprising a region rich in gallium to indium adjacent the metallized substrate.

11. A device as recited in claim 1 further including a metallized substrate on which the first layer is applied and wherein the first layer includes a minority carrier mirror comprising a region rich in gallium to indium adjacent the metallized substrate.

12. A p-n type heterojunction photovoltaic device comprising:
   a substrate;
   a base contact overlaying said substrate;
   a CuInGaSe$_2$ semiconductor layer overlaying said base contact;
   a thin film CdZnS region overlaying said CuInGaSe$_2$ semiconductor layer;
   a thin film ZnO region overlaying said CdZnS region, said ZnO region comprising a first ZnO layer in direct contact with said CdZnS region having a high resistivity to provide a high resistance path to current flow through any defects in the CdZnS region, and a second ZnO layer overlaying said first ZnO layer having a high conductivity; and
   a metallization structure overlaying said ZnO region and comprising a grid material in direct contact with said second ZnO layer.

13. A device as recited in claim 12 additionally comprising an AR coating overlaying said metallization structure.

14. A device as recited in claim 13 wherein said AR coating comprises a layer of silicon nitride followed by an overlaying layer of amorphous silicon oxide.

15. A device as recited in claim 12 wherein said CdZnS region comprises first and second CdZnS layers formed by aqueous solution growth deposition with the first layer having a low zinc content and the second layer having a high zinc content.

16. A device as recited in claim 15 wherein the zinc content (x in Cd$_{(1-x)}$Zn$_x$S) of said first CdZnS layer is between about x=0.10 and x=0.15 and the zinc content of said second CdZnS layer is between about x=0.25 and x=0.35.

17. A device as recited in claim 16 wherein the first layer includes minority carrier mirror comprising a region rich in gallium relative to indium adjacent the base contact.

18. A method of forming a multilayer p-n type heterojunction photovoltaic device on a metallized substrate comprising the steps of:
   depositing a p-type CuInGaSe$_2$ semiconductor material on the metallized substrate;
   depositing a CdZnS thin film material on the semiconductor material to form a relatively non-leaky junction;
   depositing a first layer of ZnO having a high resistivity on said CdZnS material to provide a high resistance path to current flow through any defects in the CdZnS material; and
   depositing a second layer of ZnO having a high conductivity for enhancing lateral current flow at a terminal of said device.

19. The method as defined in claim 18 wherein the CdZnS film is deposited in lower and upper layers having differing zinc contents with the lower layer that is deposited on the semiconductor material having a lower zinc content than the upper layer.

20. The method as defined in claim 19 wherein the zinc content (x in Cd$_{(1-x)}$Zn$_x$S) of the lower layer that contacts said semiconductor material is between about x=0.10 and x=0.15 and the zinc content of the upper layer that contacts the lower layer is between about x=0.25 and x=0.35.

21. The product of the method of claim 18.

22. The product of the method of claim 20.

23. A method of forming a multilayer p-n type heterojunction photovoltaic device on a metallized substrate comprising the steps of:
   depositing a p-type CuInGaSe$_2$ semiconductor material on the metallized substrate;
   depositing a first CdZnS thin film having a low Zn content on the semiconductor material by a first liquid deposition process step;
   depositing a second CdZnS thin film on the first CdZnS film wherein the second CdZnS film has a higher Zn content than the first CdZnS film by a second liquid deposition process step; and
   applying a coating to the second CdZnS film comprising a bilayer of ZnO material where each layer has a different zinc content.

24. The product of the method of claim 23.

25. The method of claim 23 wherein said steps of applying said coating comprises the substeps of:
   depositing a first high resistivity ZnO layer on the second CdZnS film; and
   depositing a second ZnO layer on the first high resistivity ZnO layer, said second ZnO layer having a lower resistivity than said first layer.

26. The method of claim 25 wherein the adhering step further comprises providing a minority carrier mirror by:
   forming a first semiconductor region having a first ratio of Ga to In adjacent to the metallized substrate; and
   forming a second semiconductor region adjacent to the first region where the ratio of Ga to In is lower than the first ratio.

27. The product of the method of claim 26.

28. The product of the method of claim 25.

* * * * *